(12) United States Patent
Mueller et al.

(10) Patent No.: US 7,364,617 B2
(45) Date of Patent: Apr. 29, 2008

(54) SEED AND SEEDHOLDER COMBINATIONS FOR HIGH QUALITY GROWTH OF LARGE SILICON CARBIDE SINGLE CRYSTALS

(75) Inventors: Stephan Mueller, Durham, NC (US); Adrian Powell, Cary, NC (US); Valeri F. Tsvetkov, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/671,015

(22) Filed: Feb. 5, 2007

(65) Prior Publication Data

US 2007/0157874 A1    Jul. 12, 2007

Related U.S. Application Data

(62) Division of application No. 10/915,095, filed on Aug. 10, 2004, now Pat. No. 7,192,482.

(51) Int. Cl.
*C30B 11/14* (2006.01)

(52) U.S. Cl. .................... 117/13; 117/89; 117/911; 117/932

(58) Field of Classification Search .............. 117/13, 117/89, 94, 97, 911, 932, 951
See application file for complete search history.

(56) References Cited

U.S. PATENT DOCUMENTS

| | | | |
|---|---|---|---|
| 4,865,685 A | 9/1989 | Palmour | |
| 4,866,005 A | 9/1989 | Davis et al. | |
| 5,011,549 A | 4/1991 | Kong et al. | |
| RE34,861 E | 2/1995 | Davis et al. | |
| 5,433,167 A | * 7/1995 | Furukawa et al. | ............ 117/84 |
| 5,667,586 A | 9/1997 | Ek et al. | |
| 5,718,760 A | 2/1998 | Carter, Jr. et al. | |
| 5,746,827 A | 5/1998 | Barrett et al. | |
| 5,958,132 A | 9/1999 | Takahashi et al. | |
| 6,025,289 A | 2/2000 | Carter, Jr. et al. | |
| 6,200,917 B1 | 3/2001 | Carter, Jr. et al. | |
| 6,218,680 B1 | 4/2001 | Carter, Jr. et al. | |
| 6,396,080 B2 | 5/2002 | Carter, Jr. et al. | |
| 6,403,982 B2 | 6/2002 | Carter, Jr. et al. | |
| 6,507,046 B2 | 1/2003 | Mueller | |
| 6,639,247 B2 | 10/2003 | Carter, Jr. et al. | |
| 6,706,114 B2 | 3/2004 | Mueller | |
| 6,814,801 B2 | 11/2004 | Jenny et al. | |
| 6,849,874 B2 | 2/2005 | Sumakeris et al. | |
| 2002/0014199 A1 | 2/2002 | Kuhn et al. | |
| 2003/0233975 A1 | 12/2003 | Jenny et al. | |

(Continued)

FOREIGN PATENT DOCUMENTS

JP    2000 044394    2/2000

(Continued)

*Primary Examiner*—Felisa Hiteshew
(74) *Attorney, Agent, or Firm*—Summa, Allan & Addition, P.A.

(57) ABSTRACT

A silicon carbide seeded sublimation method is disclosed. The method includes the steps of nucleating growth on a seed crystal growth face that is between about 1° and 10° off-axis from the (0001) plane of the seed crystal while establishing a thermal gradient between the seed crystal and a source composition that is substantially perpendicular to the basal plane of the off-axis crystal.

16 Claims, 3 Drawing Sheets

U.S. PATENT DOCUMENTS

2004/0201024 A1 10/2004 Tsvetkov et al.
2004/0206298 A1 10/2004 Jenny et al.
2005/0022724 A1 2/2005 Malta et al.
2005/0022727 A1 2/2005 Fechko et al.

FOREIGN PATENT DOCUMENTS

JP 2001 072490 3/2001

* cited by examiner

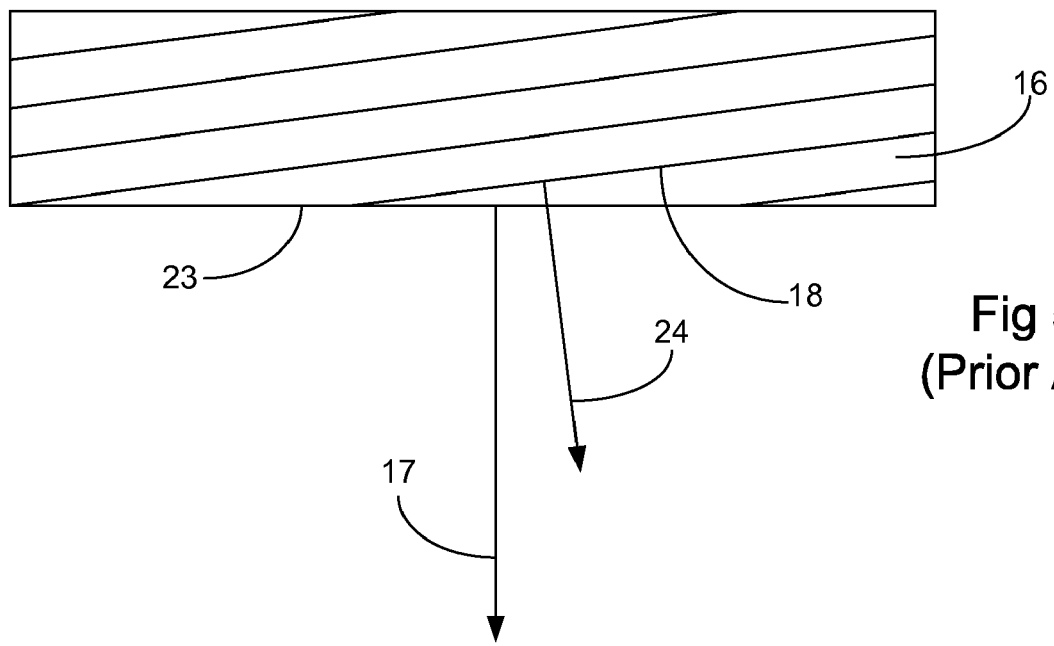
Fig 5 (Prior Art)
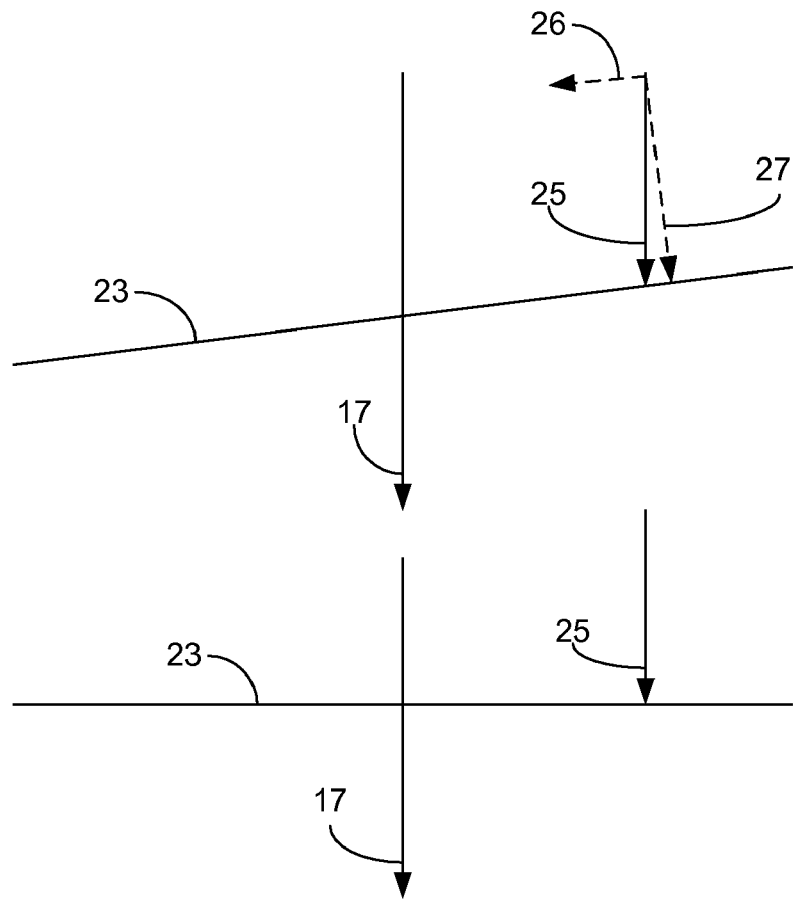
Fig 6
Fig 7

SEED AND SEEDHOLDER COMBINATIONS FOR HIGH QUALITY GROWTH OF LARGE SILICON CARBIDE SINGLE CRYSTALS

RELATED APPLICATIONS

This is a divisional of Ser. No. 10/915,095 filed Aug. 10, 2004 now U.S. Pat. No. 7,192,482.

BACKGROUND

The present invention relates to the sublimation growth of large single polytype crystals of silicon carbide.

Silicon carbide (SiC) has been known for many years to have excellent physical and electronic properties which theoretically allow production of electronic devices that can operate at higher temperatures, higher power and higher frequency than devices produced from silicon or gallium arsenide. The high electric breakdown field of about $4 \times 10^6$ V/cm, high saturated electron drift velocity of about $2.0 \times 10^7$ cm/sec and high thermal conductivity of about 4.9 W/cm-K make SiC conceptually suitable for high frequency, high power applications.

Silicon carbide also has an extremely wide band gap (e.g., 3 electron volts (eV) for alpha SiC at 300K as compared to 1.12 eV for Si and 1.42 for GaAs), has a high electron mobility, is physically very hard, and has outstanding thermal stability, particularly as compared to other semiconductor materials. For example, silicon has a melting point of 1415° C. (GaAs is 1238° C.), while silicon carbide typically will not begin to disassociate in significant amounts until temperatures reach at least about 2000° C. As another factor, silicon carbide can be fashioned either as a semiconducting material or a semi-insulating material.

As obstacles to its commercialization, however, silicon carbide requires high process temperatures for otherwise ordinary techniques, good starting materials are difficult to obtain, certain doping techniques have traditionally been difficult to accomplish, and perhaps most importantly, silicon carbide crystallizes in over 150 polytypes, many of which are separated by very small thermodynamic differences. Nevertheless, recent advances, including those discussed in U.S. Pat. Nos. 4,865,685 and 4,866,005 (now Re. 34,861) have made it possible to produce silicon carbide and silicon carbide based devices on a commercial basis and scale.

One of these advances has been the use of "off-axis" growth techniques to produce single (i.e., single polytype) crystal epitaxial layers and bulk single crystals. Generally speaking, the term "off-axis" is used to describe crystal growth techniques in which the seed crystal is presented for growth with its surface cut at an angle (usually between about 1 and 10 degrees) away from a basal plane or a major axis. Basically, it is accepted that an off-axis growth surface presents a large number of opportunities for step (lateral-step) growth that is controlled by the polytype of the crystal. The off-axis preparation of the substrate surfaces causes a series of steps and ledges to be formed to accommodate the (intentional) misorientations. The average spacing and height of the steps are largely determined by the degree of misorientation; i.e. the selected off-axis angle.

Alternatively, on-axis growth has been generally disfavored because an on-axis growth surface defines and presents far fewer ordered growth sites, and because the (0001) plane of silicon carbide does not contain polytype information. Instead, on-axis growth must proceed from defects and is thus less easily controlled.

Off-axis growth, however, presents its own unique challenges. In particular, bulk growth of large silicon carbide crystals (e.g. those suitable for wafer and device substrates) is generally carried out in seeded sublimation growth techniques, the details of which are laid out in the U.S. Pat. No. 4,866,005 incorporated above, and which have become familiar to those of skill in this art. Another relevant summary is set forth in Zetterling, Process Technology for Silicon Carbide Devices, INSPEC (2002) §§ 2.2.2.1-2.2.2.4.

In brief summary, a seeded sublimation technique includes a graphite (or similar) crucible that holds the source powder and the seed crystal. The crucible is heated (e.g. inductively) in a manner that establishes a thermal gradient between the source powder (hotter) and the seed crystal (cooler). The main gradient is typically referred to as the "axial" gradient because it typically (and intentionally) falls parallel to the axis of the growth crucible in which the source materials are at the bottom or lower portions and the seed crystal is attached to the upper portions and opposite some or all of the source materials. When the source powder is heated above SiC's sublimation temperature, the powder generates vaporized species that migrate generally or predominantly along the axial gradient and condense upon the seed crystal to produce the desired growth. In typical SiC seeded sublimation techniques, the source powder is heated to above about 2000° C.

During seeded sublimation growth of bulk single crystals, in order to keep the basal plane of the crystal (the plane that is parallel to the principal plane of symmetry of the crystal) on the growth surface of the crystal, off-axis techniques force the growth of convex crystals. In turn, encouraging such convex growth in a seeded sublimation technique typically requires the application of relatively high radial thermal gradients in addition to the axial (growth direction) thermal gradient. These radial gradients add stress to the growing crystal at growth temperatures, and these in turn create other stresses when the crystal cools to use or room temperature.

In silicon carbide, off-axis growth presents yet another problem based on the combination of two factors. As the first factor, in silicon carbide, the primary slip plane is the basal plane. As the second factor, changes in thermal gradients apply stress to crystals in the direction in which the gradient is changing; i.e., changes in the axial gradient apply stress to the crystal in the axial direction. As is understood by those familiar with such factors, the existence of thermal gradients does not generate the stress, but rather the rate of change of those thermal gradients. Stated differently, if a thermal gradient represents the change in temperature per unit of distance, the stresses are generated by the rate of change of the gradient per unit distance (i.e., a second derivative function).

When—as in off-axis sublimation growth—the basal plane is off axis to the major growth direction, these axial forces (caused by the rate of change of the gradient) include and thus apply a component parallel to the slip plane and thus generate and encourage slip defects. The magnitude of the basal-parallel component increases as the off axis angle increases in a manner common to the well-understood resolution of vectors into their respective components.

As a result, increasing the angle of the off-axis presentation of a growing silicon carbide crystal, or its seed, increases the slip forces applied to the basal plane and these forces in turn increase the concentration of slip defects per unit area.

By comparison, in on-axis growth the axial forces caused by changes in thermal gradients neither include nor apply a component parallel to the basal (slip) plane. Thus, slip defects can be more easily avoided during on-axis growth. As noted above, however, on-axis growth presents less polytype information and lower surface step density per unit area, thus making on-axis growth a relatively difficult technique for replicating the polytype of the seed crystal into the growing crystal.

Accordingly, both on and off-axis seeded sublimation growth techniques for silicon carbide present particular disadvantages.

SUMMARY

In a first aspect, the invention is a silicon carbide growth system comprising a crucible; a silicon carbide source composition in said crucible; a seed holder in said crucible; a silicon carbide seed crystal on said seed holder; means for creating a major thermal gradient in said crucible that defines a major growth direction between said source composition and said seed crystal for encouraging vapor transport from said source composition to said seed crystal; and said seed crystal being positioned on said seed holder with the macroscopic growth surface of said seed crystal forming an angle of between about 70° and 89.5° degrees relative to said major thermal gradient.

In a similar aspect, the invention is a silicon carbide growth system comprising a crucible; a silicon carbide source composition in said crucible; a seed holder in said crucible; a silicon carbide seed crystal on said seed holder; means for creating a major thermal gradient in said crucible that defines a major growth direction between said source composition and said seed crystal for encouraging vapor transport between said source composition and said seed crystal; and said seed crystal being positioned on said seed holder with the macroscopic growth surface of said seed crystal forming an angle of between about 70° and 89.5° degrees relative to said major thermal gradient and said major growth direction and with the crystallographic orientation of said seed crystal having the c-axis of said crystal forming an angle with said major thermal gradient of between about 0° and 2°

In another aspect, the invention is a method of growing large single crystals of silicon carbide with reduced defects. The method comprises nucleating growth on a seed crystal growth face that is between about 0.5° and 10° off-axis from the (0001) plane of the seed crystal while establishing a thermal gradient between the seed crystal and a source composition that is substantially perpendicular to the basal plane of the off-axis crystal.

In another method aspect, the invention comprises establishing a major growth temperature gradient between a silicon carbide seed crystal and a silicon carbide source composition and positioning the seed crystal on the seed holder with the macroscopic growth face of the seed crystal at an angle of between about 70° and 89.5° with respect to the major growth gradient.

In yet another method aspect, the invention comprises establishing a major growth temperature gradient between a silicon carbide seed crystal and a silicon carbide source composition; presenting a growth face on the seed crystal that is between about 1° and 10° off axis from the (0001) plane; and positioning the seed crystal on the seed holder with the growth face at an angle of between about 70° and 89.5° with respect to the major growth gradient.

The foregoing and other objects and advantages of the invention and the manner in which the same are accomplished will become clearer based on the followed detailed description taken in conjunction with the accompanying drawings.

BRIEF DESCRIPTION OF THE DRAWINGS

FIG. 5 is a diagram illustrating the geometric relationships between an off-axis seed crystal and a major thermal gradient.

FIG. 6 is a vector diagram illustrating stress applied to the basal (slip) plane of off-axis silicon carbide.

FIG. 7 is a vector diagram illustrating stress applied to the basal (slip) plane of on-axis silicon carbide.

DETAILED DESCRIPTION

In a first embodiment, the present invention is a seeded sublimation growth system for silicon carbide. In this aspect, the invention comprises a crucible, a silicon carbide source composition in the crucible, a seed holder in the crucible, a silicon carbide seed crystal on the seed holder, and means for creating a major thermal gradient in the crucible that defines a major growth direction between the source composition and the seed crystal for encouraging vapor transport between the source composition and the seed crystal. The seed crystal is positioned on the seed holder with the macroscopic growth surface of the seed crystal forming an angle of between about 70° and 89.5° relative to the major thermal gradient and the major growth direction and with the crystallographic orientation of the seed crystal having the c-axis of the crystal forming an angle with the major thermal gradient of between about 0° and 2°

Figure 1:
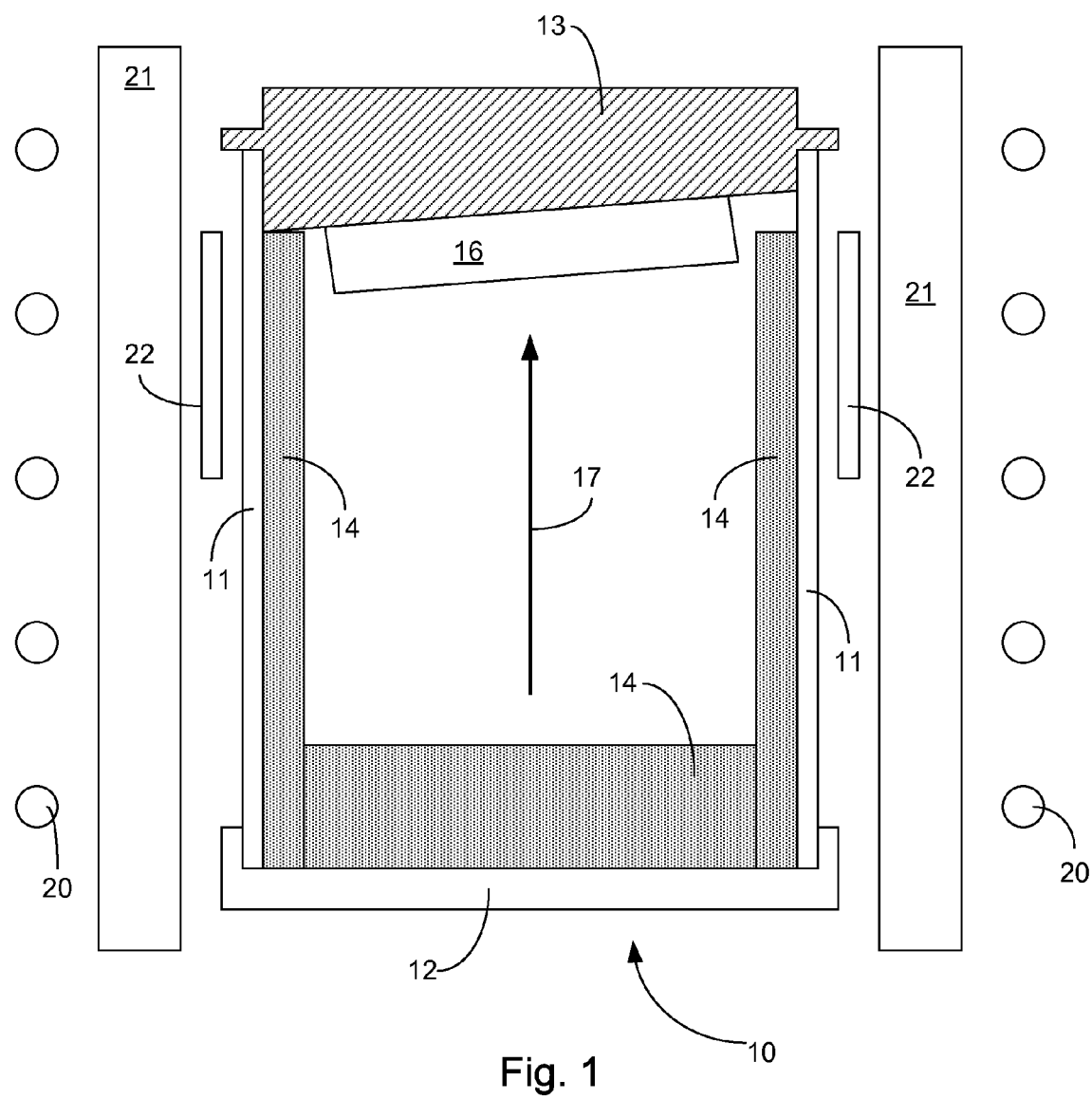
FIG. 1 is a cross-sectional schematic diagram of a seeded silicon carbide system according to the present invention.

FIG. 1 is a schematic cross sectional view of a representative seeded silicon carbide sublimation system according to the present invention. Those of ordinary skill in this art will recognize that FIG. 1 is a generalized view of such a system, is not to scale, and that a number of variations can be included or substituted while still practicing the invention claimed herein. Accordingly, FIG. 1 should be understood as illustrative and exemplary rather than limiting of the present invention.

FIG. 1 illustrates a crucible broadly designated at 10 that is formed of a tubular portion 11, a bottom portion 12, and a seed holder 13. In many embodiments, the preferred material for the crucible 10 is graphite, but other materials can be incorporated either partially or entirely, and potentially as coatings. Examples include tantalum carbide (TaC) niobium carbide (NbC) and related carbide compositions.

A silicon carbide source composition 14 is positioned in the crucible. As illustrated in FIG. 1, portions of the silicon carbide source composition 14, which is most typically a silicon carbide source powder, are positioned in the crucible 10.

A seed crystal 16 is positioned on the seed holder 13. In order to encourage sublimation growth on the seed crystal 16, a thermal gradient represented by the arrow 17 is established in the crucible 10. As illustrated in FIG. 1 and as frequently carried out in these techniques, the graphite or other crucible 10 is heated inductively by passing current through a coil illustrated in cross-section at 20. The coil is typically maintained outside of a quartz tube 21. In order to create a thermal gradient, insulation schematically illustrated at 22 is positioned in and around the quartz tube 21 and the crucible 10. The goal is to create a gradient in which the source powder is heated to approach the sublimation temperature of silicon carbide while the seed crystal 16 is maintained at a slightly lower temperature, with the changing temperature being relatively even along the gradient 17 in most circumstances. The temperatures of the source material 14 and the seed crystal 16 are preferably monitored, typically with infrared (optical) techniques and instruments. If necessary the current applied to the coil 20 or the position of the insulation 22 can be adjusted to provide the desired or necessary gradient. Alternatively, some techniques and systems use resistance heating rather than induction heating.

Typically, sublimation growth is carried out in an atmosphere that is otherwise inert to the sublimation process. The usual options include a noble gas such as argon, other gases such as hydrogen, or even a vacuum.

The phrase "major thermal gradient" is used herein to highlight the understanding in this art that at the extremely high temperatures being used, a number of thermal gradients can exist extending in a number directions. Thus, the gradients are properly understood as vector quantities; i.e., being characterized by both magnitude and direction. The major thermal gradient, however, is the one established between the seed crystal 16 and the source powder 14, and is best understood conceptually as being a vertical (or "axial") gradient in the schematic orientation of FIG. 1 and in most growth techniques. Because of the nature of seeded sublimation growth, such growth will predominantly proceed in the same direction as the major thermal gradient.

Other growth techniques specifically incorporate radial temperature gradients; i.e., those perpendicular to the major thermal gradient and smaller in magnitude than the major thermal gradient. Indeed, if a radial gradient exceeds the magnitude of an axial gradient, the most growth will occur along the radial gradient rather than the axial gradient. Thus, radial gradients are sometimes created and used intentionally and the invention can be used in conjunction with such radial gradients if desired or necessary for any particular goal or purpose.

More fundamental to the invention, however, is the positioning of the seed crystal 16 on the seed holder 13. In the invention, the seed crystal 16 is positioned on the seed holder 13 with the microscopic growth surface of the seed crystal forming an angle of between about 70 and 89.5° (FIG. 1 is not necessarily to scale in this regard) relative to the major thermal gradient 17 and the major growth direction that is defined by and thus parallel to the major thermal gradient. The crystallographic orientation of the seed crystal is also positioned so that the c-axis of the crystal 16 forms an angle with the major thermal gradient 17 of between about zero and 2°

In the preferred embodiments of the invention, the growth surface of the seed crystal 16 is between about 1° and 10° off-axis from the (0001) plane of the crystal. Stated differently, in this embodiment, both the seed holder 13 and the seed crystal 16 are off-axis.

Alternatively, advantages can exist in embodiments in which the growth surface of the seed crystal is a basal plane of the crystal and when such basal plane is the (0001) plane of the crystal. Stated differently, in this embodiment, the seed holder 13 is off-axis while the seed crystal 16 is on-axis. In the more preferred embodiments, however, the seed crystal itself is off axis so that the c-axis of the crystal forms an angle with the major thermal gradient of less than about 1°

As further well understood in this art, the c-axis of the crystal is the axis perpendicular to the principal plane of symmetry. Additionally, and as also used consistently herein, the plane of a crystal that is parallel to the principal plane of symmetry is referred to as a basal plane.

A number of aspects of the invention are illustrated schematically in FIGS. 2 through 7. As a brief prologue, these figures illustrate several relationships. One such relationship is that of the seed crystal face to the seed crystal c-axis. A face that is non-perpendicular to the c-axis is an "off-axis" face. A second relationship is that of the seed holder to the major thermal gradient in the growth environment. When the seed holder is non-perpendicular to the major thermal gradient, the seed holder is "off-axis" to that gradient. A third relationship is that between the face (macroscopic growth surface) of the seed crystal and the major thermal gradient when the seed crystal is mounted for growth on the seed holder.

Figure 2:
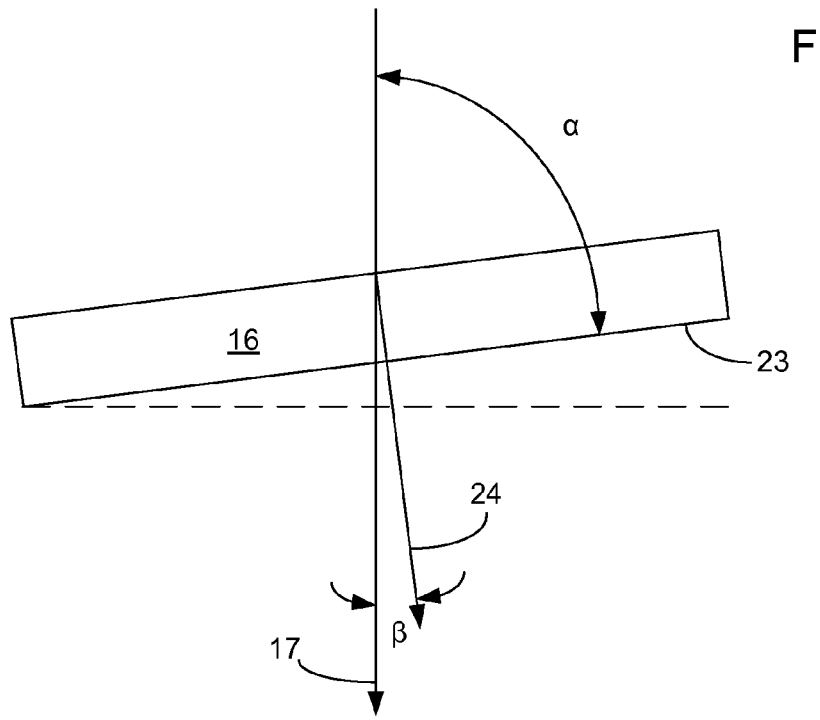
FIG. 2 is a diagram illustrating the geometric relationships between and among the seed crystal and the major thermal gradient according to the present invention.

In FIG. 2, the thermal gradient is again schematically illustrated at 17 and the seed crystal at 16. The growth surface of the seed crystal is designated at 23 and the angle alpha (a) is illustrated between the major thermal gradient 17 and the growth surface 23. As noted above, alpha is preferably between about 70° and 89.5°, with a range of between about 80° and 88° being more preferred. The c-axis of the crystal is illustrated in 24, and is separated from the major thermal gradient 17 by a relatively small angle beta (β) of between about 0° and 2°Because FIG. 2 is schematic, it will be understood that alpha and beta are not drawn to scale.

Figure 3:
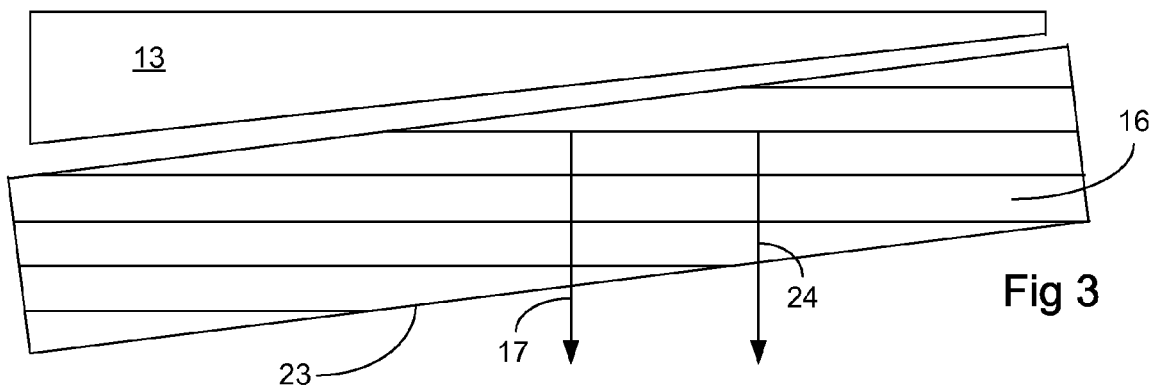
FIG. 3 is a schematic diagram of an off-axis seed in an off-axis orientation.

FIG. 3 is another schematic illustration showing the embodiment in which both the seed holder 13 and the seed crystal 16 are in an off-axis orientation. As seen in this combination, the c-axis of the crystal 24 and the major thermal gradient 17 are essentially parallel to each other while the growth surface 23 presents appropriate growth step opportunities in a manner desired or advantageously presented by using an off-axis seed. FIG. 3 should be viewed in comparison to FIGS. 5, 6 and 7 as helping to further illustrate the invention.

Figure 4:
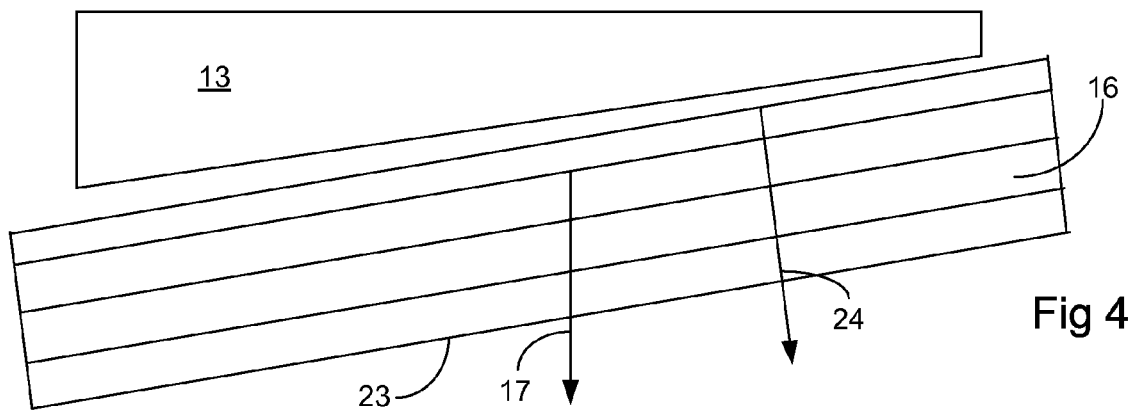
FIG. 4 is a schematic diagram of an on-axis seed in an off-axis orientation.

FIG. 4 illustrates that certain embodiments of the invention provide advantages even with on-axis seed crystals. As shown in FIG. 4, the seed holder 13 provides an off-axis orientation for the on-axis seed crystal 16. Because the crystal will tend to grow with its basal plane perpendicular to the growth direction, many of the propagating defects such as 1c screw threading dislocations will intersect with each other, an effect referred to as recombination (not to be confused with the "recombination" of electrons and holes in p-n devices). In turn such recombination reduces the number of defects in the resulting crystal. In conventional off-axis growth, the basal plane is not perpendicular to the growth direction and thus off-axis growth presents fewer recombination opportunities.

FIG. 5 illustrates some of the relationships in a more conventional (prior art) off-axis technique in which the growth face 23 of the crystal 16 is an off-axis face, but with the c-axis of the crystal 24 being off-axis from the major thermal gradient 17 to the same extent as the crystal is off-axis from a basal plane 18. As noted in the Background, this presents some favorable aspects for replicating the polytype of the seed crystal 16, but creates the situation shown in FIG. 6. FIG. 6 is a vector diagram in which the growth surface 23 of the seed crystal (not otherwise illustrated in FIG. 6) is off-axis to the major thermal gradient 17.

Any changes in the thermal gradient are exerted in the same vector direction as the thermal gradient 17. The vector representing the forces from the changing gradient is illustrated at 25. Because the vector 25 is not directly perpendicular to the growth surface 23, its application against surface 23 can be resolved into two component vectors 26 and 27. In particular, vector component 26 exerts a force parallel to the basal plane. As further noted in the Background, because the basal plane is the slip plane for silicon carbide, the vector component 26 encourages slip defects during growth.

FIG. 7 is a vector diagram illustrating the advantages of the invention. Using the invention, because the c-axis of the crystal is either parallel or nearly parallel to the thermal gradient 17, the force vector 25 generated by the changes in the thermal gradient is applied substantially entirely perpendicularly against the slip plane 23. As a result, there is either no component, or at most a minimal component, of force exerted against the slip plane. Thus, the invention helps avoid slip defects during seeded sublimation growth.

Theoretically, the invention can include the use of a on-axis seed holder with a wedge-shaped seed in order to present both an off-axis growth face and a basal plane perpendicular to the growth direction (alternatively stated as the c-axis parallel to the growth direction). Such a wedge shaped seed presents a number of mechanical difficulties, however, and thus will be used less frequently. Similarly, it will be understood that tilting the entire crucible or tilting the thermal gradient can produce the same effective geometry. Such techniques are relatively complex, however, and thus may be less attractive from a practical or commercial standpoint, all other factors being equal.

In preferred embodiments the seed crystal has a polytype selected from the group consisting of the 4H and 6H polytypes of silicon carbide.

In preferred embodiments, the seed-holding face of the seed holder is maintained at an angle that is between about 4° off horizontal (horizontal being defined as perpendicular to the major growth gradient) and with the growth face of the seed crystal about 4° off-axis from the (0001) plane of the crystal. This can, of course (and like all of the other angles described herein), be expressed in terms of a complementary angle; i.e., and angle of about 86° with respect to the major growth gradient.

Accordingly, in another aspect, the invention is a method of growing large single crystals of silicon carbide with reduced defects.

In its broadest aspect, the method comprises nucleating growth on a seed crystal growth face that is between about 1° and 10° off-axis from the (0001) plane of the seed crystal while establishing a thermal gradient between the seed crystal and a source composition that is substantially perpendicular to the basal plane of the off-axis crystal.

Further to this aspect, the invention comprises establishing the major growth temperature gradient between the silicon carbide seed crystal and the silicon carbide source composition, presenting a growth face on the seed crystal that is between about 1° and 10° off-axis from the (0001) plane; and positioning the seed crystal on the seed holder with the growth face at an angle of between about 70° and 80° C. with respect to the major growth gradient.

Accordingly, the combination of an off-angle seed holder with an off-angle seed crystal results in a seed surface that is microscopically on-axis (i.e., the crystallographic c-axis of the silicon carbide seed wafer forms an angle of between about zero and 2° with the major flux direction of the silicon carbide growth species), but because the seed wafer is off-axis (i.e., the macroscopic seed surface is neither perpendicular nor near-perpendicular to the crystallographic c-axis of silicon carbide) the seed surface possesses a higher density of surface steps per unit area compared to a seed with a macroscopic seed surface perpendicular to (or nearly perpendicular to) the crystallographic c-axis of silicon carbide. These surface steps act as nucleation sites enabling a step-flow growth mode which is favorable for the nucleation and growth of high-quality silicon carbide.

The invention provides good polytype stability and stable growth after nucleation, the avoidance of split defects, and the resolution of the thermal stress component in the basal plane is dominated by the presence of radial temperature gradients in the crystal which is favorable for a lower probability of the thermal stress related formation of basal plane dislocations in the silicon carbide crystal during growth or cooldown.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A seeded sublimation method of growing large single crystals of silicon carbide with reduced defects, the method comprising:
   nucleating growth on a seed crystal growth face that is between about 1° and 10° off-axis from the (0001) plane of the seed crystal;
   while establishing a thermal gradient between the seed crystal and a source composition that is substantially perpendicular to the basal plane of the off-axis crystal.

2. A seeded sublimation method of growing large single crystals of silicon carbide with reduced defects, the method comprising:
   establishing a major growth temperature gradient between a silicon carbide seed crystal and a silicon carbide source composition; and
   positioning the seed crystal on the seed holder with the macroscopic growth face of the seed crystal at an angle of between about 70° and 89.5° with respect to the major growth gradient.

3. A method according to claim 2 comprising positioning the seed crystal on the seed holder with the macroscopic growth face of the seed crystal at an angle of between about 70° and 80° with respect to the major growth gradient.

4. A method according to claim 2 comprising establishing the major temperature gradient with a total temperature difference of between about 50 and 200° C.

5. A method according to claim 2 comprising presenting the basal plane of the seed crystal as the growth surface.

6. A method according to claim 2 comprising slicing the resulting bulk crystal into wafers.

7. A method according to claim 6 comprising polishing the sliced wafers.

8. A method according to claim 6 comprising growing an epitaxial layer of a semiconductor material on the sliced wafer.

9. A method according to claim 8 comprising growing an epitaxial layer selected from the group consisting of silicon carbide and Group III nitrides.

10. A seeded sublimation method of growing large single crystals of silicon carbide with reduced defects, the method comprising:

establishing a major growth temperature gradient between a silicon carbide seed crystal and a silicon carbide source composition;

presenting a growth face on the seed crystal that is between about 1° and 10° off axis from the (0001) plane; and positioning the seed crystal on the seed holder with the growth face at an angle of between about 70° and 89.5° with respect to the major growth gradient.

11. A method according to claim 10 comprising establishing the major growth gradient between silicon carbide source powder and the seed crystal.

12. A method according to claim 10 comprising presenting the seed crystal on a seed holder that forms an angle of between about 70° and 89.5° with respect to the major growth gradient.

13. A method according to claim 10 comprising presenting the seed crystal on a seed holder that forms an angle of between about 70° and 80° with respect to the major growth gradient.

14. A method according to claim 10 comprising presenting the seed crystal on a seed holder that forms an angle of about 86° with respect to the major growth gradient.

15. A method according to claim 10 comprising presenting a growth face on the seed crystal that is about 4° off-axis from the (0001) plane.

16. A method according to claim 10 comprising presenting a seed crystal that has a polytype selected from the group consisting of the 4H and 6H polytypes of silicon carbide.

* * * * *